(12) United States Patent
Yamasaki et al.

(10) Patent No.: US 11,414,742 B2
(45) Date of Patent: Aug. 16, 2022

(54) SUBSTRATE PROCESSING APPARATUS, SUBSTRATE PROCESSING METHOD, AND STORAGE MEDIUM

(71) Applicant: TOKYO ELECTRON LIMITED, Tokyo (JP)

(72) Inventors: Hideaki Yamasaki, Nirasaki (JP); Tomonari Urano, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 508 days.

(21) Appl. No.: 15/935,651

(22) Filed: Mar. 26, 2018

(65) Prior Publication Data

US 2018/0209033 A1   Jul. 26, 2018

Related U.S. Application Data

(62) Division of application No. 15/044,620, filed on Feb. 16, 2016, now abandoned.

(30) Foreign Application Priority Data

Feb. 17, 2015 (JP) ................................. 2015-028939

(51) Int. Cl.
  *C23C 14/24*   (2006.01)
  *H01L 21/285*   (2006.01)
  (Continued)

(52) U.S. Cl.
  CPC .............. *C23C 14/24* (2013.01); *C23C 16/08* (2013.01); *C23C 16/4581* (2013.01);
  (Continued)

(58) Field of Classification Search
  CPC ... C23C 14/24; C23C 16/08; C23C 16/45557; C23C 16/4581; C23C 16/4586; C23C 16/56
  See application file for complete search history.

(56) References Cited

U.S. PATENT DOCUMENTS

2004/0137169 A1* 7/2004 Carollo ................. C23C 16/455
                                                                427/579
2007/0212811 A1* 9/2007 Hanawa ............ H01J 37/32357
                                                                438/104

(Continued)

FOREIGN PATENT DOCUMENTS

JP           9-82655 A      3/1997
JP        2004-47644 A      2/2004
(Continued)

*Primary Examiner* — Kelly M Gambetta
(74) *Attorney, Agent, or Firm* — Nath, Goldberg & Meyer; Jerald L. Meyer; Tanya E. Harkins

(57) ABSTRACT

There is provided a substrate processing apparatus which includes: a substrate mounting table installed in a vacuum vessel; a gas supply part configured to supply a processing gas into the vacuum vessel; a vacuum-exhausting part configured to exhaust the interior of the vacuum vessel; an elevating member configured to lift up and down a substrate while holding the substrate mounted on the mounting table; and a control part configured to output a control signal to execute a first step of supplying the processing gas onto the substrate and setting an internal pressure of the vacuum vessel to a first pressure, a second step of changing the internal pressure to a second pressure lower than the first pressure, and a third step of lifting up the substrate from the mounting table after the first step and before the second step or in parallel with the second step.

1 Claim, 8 Drawing Sheets

(51) Int. Cl.
*H01L 21/768* (2006.01)
*C23C 16/08* (2006.01)
*C23C 16/455* (2006.01)
*C23C 16/458* (2006.01)
*C23C 16/56* (2006.01)

(52) U.S. Cl.
CPC .... *C23C 16/4586* (2013.01); *C23C 16/45557*
(2013.01); *C23C 16/56* (2013.01); *H01L*
*21/28562* (2013.01); *H01L 21/76843*
(2013.01)

(56) References Cited

U.S. PATENT DOCUMENTS

| | | | |
|---|---|---|---|
| 2008/0156260 | A1 | 7/2008 | Shive et al. |
| 2010/0248490 | A1* | 9/2010 | McMillin .......... H01J 37/32788 |
| | | | 438/716 |
| 2011/0017706 | A1* | 1/2011 | Takahashi ............. H01L 21/318 |
| | | | 216/69 |
| 2012/0251737 | A1* | 10/2012 | Osaki .................. H01L 29/4983 |
| | | | 427/575 |

FOREIGN PATENT DOCUMENTS

| | | |
|---|---|---|
| JP | 2012-072475 A | 4/2012 |
| JP | 2013-139609 A | 7/2013 |
| KR | 2001-0056697 A | 7/2001 |
| WO | 2009/008474 A1 | 1/2009 |

\* cited by examiner

SUBSTRATE PROCESSING APPARATUS, SUBSTRATE PROCESSING METHOD, AND STORAGE MEDIUM

CROSS-REFERENCE TO RELATED APPLICATION

This is a Divisional Application of U.S. patent application Ser. No. 15/044,620, filed Feb. 16, 2016, and claiming benefit of Japanese Patent Application No. 2015-028939, filed on Feb. 17, 2015, in the Japan Patent Office, the disclosure of which is incorporated herein in its entirety by reference.

TECHNICAL FIELD

The present disclosure relates to a technique of performing a process on a substrate by supplying a processing gas onto the substrate in a vacuum atmosphere.

BACKGROUND

In a semiconductor manufacturing process, in order to reduce resistance of a contact portion between wirings formed in a semiconductor wafer (hereinafter, simply referred to as a "wafer"), there is a process of forming a titanium (Ti) film on an inner side of a hole and nitriding a surface of the Ti film, prior to filling of the hole with metal.

For example, the Ti film is formed by a CVD (Chemical Vapor Deposition) method in which a wafer is mounted on a mounting table serving also as a lower electrode installed inside a chamber and a processing gas is supplied from a shower head serving also as an upper electrode while maintaining the interior of the chamber at a predetermined degree of vacuum. Thereafter, for example, a high frequency is applied to the shower head so as to generate plasma such that the processing gas is activated to cause a chemical reaction. Reaction products thus generated are deposited on a surface of the wafer to form the Ti film.

The Ti film is formed by supplying, for example, a $TiCl_4$ gas and an $H_2$ gas as the processing gases into the chamber and plasmarizing these gases. In addition, a nitriding process for the surface of the Ti film is performed by supplying a nitriding gas, e.g., an $NH_3$ gas, into the chamber.

After the nitriding process is completed, an internal pressure of the chamber is reduced to discharge the $NH_3$ gas from the chamber. At this time, it is observed that a wafer sliding phenomenon that the wafer slides on the surface of the mounting table occurs. This peels off a thin film deposited on the surface of the mounting table by a friction caused by the wafer sliding, which may result in the occurrence of particles.

In a plasma process, a metal mechanical chuck cannot be used to prevent an abnormal discharge at the time of generating plasma. In addition, in a process at a high temperature of 400 degrees C. or more, an electrostatic chuck cannot be used since the process temperature exceeds a heat-resistant temperature. Therefore, a chuck cannot be used to prevent the wafer from sliding.

In addition, the present inventors have made studies on increasing the film thickness by repeating a Ti film forming process and a nitriding process a multiple number of times. In this case, there is a possibility that a wafer sliding phenomenon occurs every time an $NH_3$ gas is discharged from a chamber, which may result in a poor in-plane uniformity of film thickness in addition to the occurrence of particles.

For example, there is known a configuration in which a guide ring for guiding a wafer is installed in a periphery of a surface of a mounting table. In such a configuration, a movement range of the wafer is restricted even if a wafer sliding phenomenon occurs during a film forming process. As such, the wafer can be transferred between an external transfer mechanism and the mounting table. However, if the wafer is slid to make contact with the guide ring, a thin film deposited on the guide ring may be peeled off, which may result in the occurrence of particles. In addition, if the wafer is slid to be too close to the guide ring, a deviation in concentration distribution of a film-forming gas may be generated. This degrades an in-plane uniformity of film thickness and partially increases contamination of a rear surface of the wafer.

In addition, there is known an example in which a nitriding process is performed with a plasmarized nitrogen gas in a state where a wafer is lifted up to be spaced apart from a mounting table by a predetermined distance. In this example, a peripheral portion of a rear surface of the wafer is in contact with plasma so that active species contributing to the nitriding process are increased in a periphery of a front surface of the wafer. This decreases a difference in the amount of nitrogen introduced between the central portion and the periphery of the wafer, thereby achieving the nitriding process with high in-plane uniformity. However, since this example does not take into consideration the sliding of the wafer mounted on the mounting stable during the nitriding process, it is difficult to address the issues related to the present disclosure.

SUMMARY

Some embodiments of the present disclosure provide a technique of preventing a substrate mounted on a mounting table from being slid due to a pressure variation, in performing a process on a substrate by supplying a processing gas onto the substrate in a vacuum atmosphere.

According to one embodiment of the present disclosure, there is provided a substrate processing apparatus of performing a process on a substrate by supplying a processing gas onto the substrate in a vacuum atmosphere, including: a substrate mounting table installed in a vacuum vessel; a gas supply part configured to supply the processing gas into the vacuum vessel; a vacuum-exhausting part configured to exhaust the interior of the vacuum vessel; an elevating member configured to move up and down between an ascending position defined above a surface of the mounting table and a descending position equal to or lower than a level of the surface of the mounting table and is configured to lift up and down the substrate while holding the substrate mounted on the mounting table; and a control part configured to output a control signal to execute a first step, a second step and a third step, the first step being to supply the processing gas onto the substrate mounted on the mounting table and set an internal pressure of the vacuum vessel to a first pressure, the second step being to change the internal pressure to a second pressure lower than the first pressure, and the third step being to lift up the substrate from the mounting table by the elevating member after the first step and before the changing the internal pressure or in parallel with the changing.

According to another embodiment of the present disclosure, there is provided a method of processing a substrate by supplying a processing gas onto the substrate in a vacuum atmosphere. The method includes: mounting the substrate on a mounting table installed in a vacuum vessel; supplying the processing gas onto the substrate mounted on the mounting table and setting an internal pressure of the vacuum vessel to a first pressure; subsequently, changing the internal pressure to a second pressure lower than the first pressure; and after the supplying the processing gas, lifting up the substrate from the mounting table by an elevating member before the changing the internal pressure or in parallel with the changing.

According to yet another embodiment of the present disclosure, there is provided a non-transitory computer-readable storage medium that stores a computer program used for a substrate processing apparatus of performing a process on a substrate by supplying a processing gas onto the substrate mounted on a mounting table in a vacuum vessel while maintaining a vacuum atmosphere, wherein the computer program is organized with instructions for executing the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
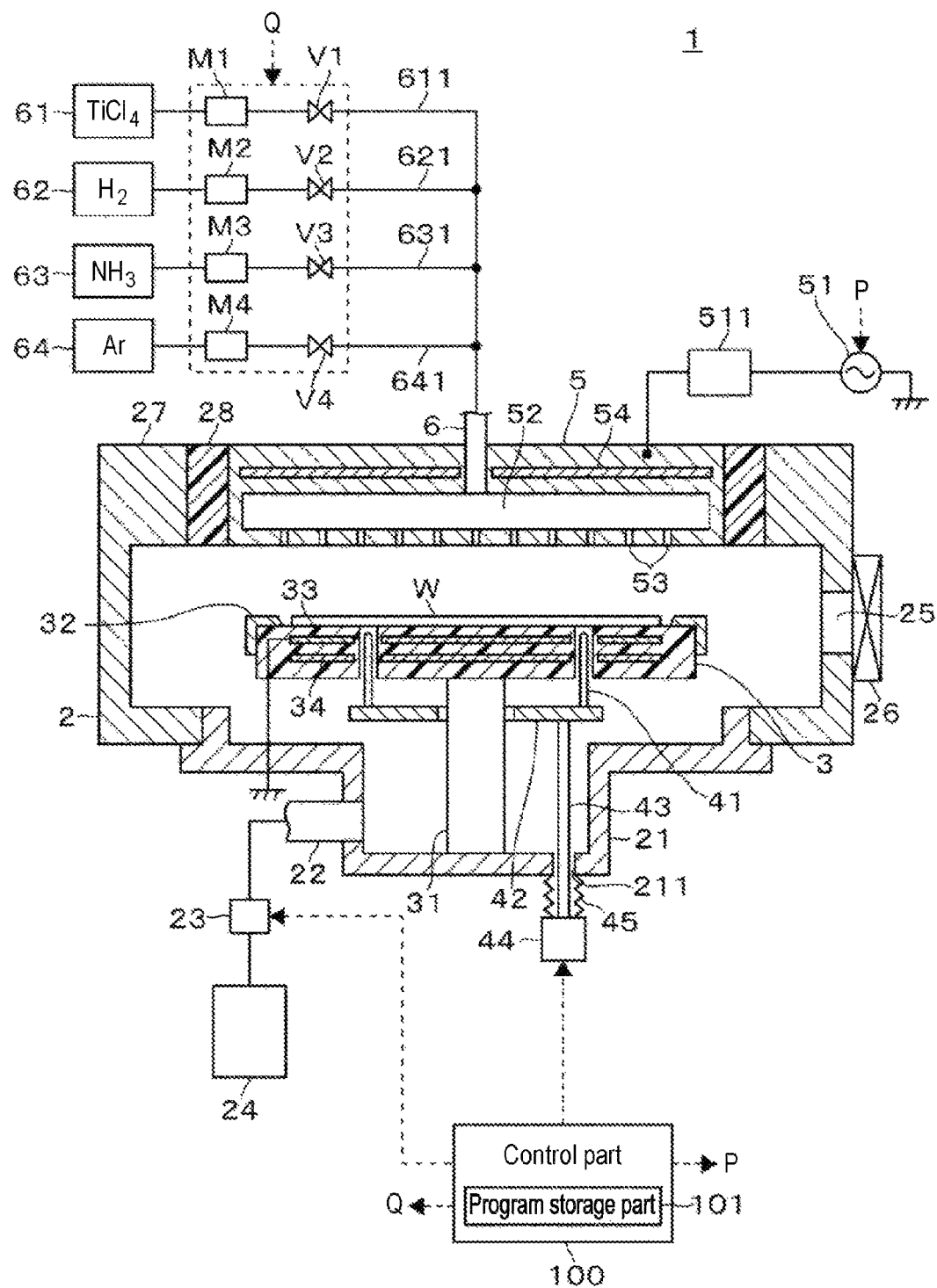
FIG. 1 is a longitudinal sectional view showing a substrate processing apparatus according to an embodiment of the present disclosure.

Hereinafter, an example of a configuration of a substrate processing apparatus according to an embodiment of the present disclosure will be described with reference to FIG. 1. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A substrate processing apparatus 1 is to form a film such as a Ti film by a plasma CVD, and includes an airtight cylindrical vacuum vessel 2. For example, a downward-protruding cylindrical exhaust chamber 21 is formed in the central portion of a bottom wall of the vacuum vessel 2. An exhaust path 22 is connected to a lateral side of the exhaust chamber 21. The exhaust path 22 is coupled to a vacuum-exhausting part 24 via a pressure adjusting part 23 equipped with a pressure adjusting valve such as a butterfly valve, so that the interior of the vacuum vessel 2 is depressurized up to a predetermined degree of vacuum. In addition, a transfer port 25 through which a wafer W is transferred between the vacuum vessel 2 and a transfer chamber (not shown), is formed in a lateral side of the vacuum vessel 2. The transfer port 25 is configured to be opened and closed by a gate valve 26.

A mounting table 3 configured to hold the wafer W in a substantially horizontal posture is installed inside the vacuum vessel 2. For example, the mounting table 3 is supported by a cylindrical support member 31 at the central portion of a lower surface thereof. The mounting table 3 is made of ceramics such as aluminum nitride (AlN) and has an upper surface coated with a material such as nickel (Ni). An arithmetic average surface roughness of the upper surface of the mounting table 3 is set to, e.g., 10 µm or more. A guide ring 32 configured to guide the wafer W is disposed in the periphery of the upper surface of the mounting table 3. In some embodiments, the mounting table 3 may be made of ceramics of the aluminum nitride alone or may be made entirely of a metal material such as nickel.

The arithmetic average surface roughness (hereinafter, simply referred to as an "average surface roughness Ra") represents a value obtained by extracting a reference length of 1 from a roughness curve in a direction of its average line, taking an X axis in the direction of the average line of the reference length of 1 and a Y axis in a direction of longitudinal magnification, summing absolute values of deviations of measurement curves which are deviated from the average line of the reference length of 1, and averaging the absolute values. When the roughness curve is expressed by y=f(x), the average surface roughness Ra is derived according to the following equation.

$$Ra = \frac{1}{\ell} \int_0^\ell |f(x)| dx$$

In addition, the mounting table 3 includes, for example, a grounded lower electrode 33 embedded therein and a heating mechanism 34 disposed below the lower electrode 33. Based on a control signal from a control part 100 to be described later, a power supply (not shown) applies power to the lower electrode 33 and the heating mechanism 34 so that the wafer W is heated at a preset temperature, e.g., 400 degrees C. or higher. Further, if the mounting table 3 is made entirely of metal, it is not necessary to embed the lower electrode 33 in the mounting table 3 since the entire mounting table 3 acts as the lower electrode.

In addition, three or more (e.g., three) lifting pins 41 as a lifting member configured to lift up and down the wafer W while supporting the wafer W mounted on the mounting table 3 are installed in the mounting table 3. These lifting pins 41 are made of, for example, ceramics such as alumina ($Al_2O_3$), or quartz. Lower ends of the lifting pins 41 are attached to a common support plate 42. The common support plate 42 is coupled to a lifting mechanism 44 formed of, e.g., an air cylinder, which is installed outside the vacuum vessel 2, via a lifting shaft 43.

For example, the lifting mechanism 44 is installed below the exhaust chamber 21. An opening 211 through which the lifting shaft 43 passes, is formed in the bottom of the exhaust chamber 21. A bellows 45 is installed between the opening 211 and the lifting mechanism 44. In addition, the support plate 42 is formed in a shape which is vertically movable without interfering with the support member 31 of the mounting table 3. Thus, the lifting pins 41 are configured to move up and down by the lifting mechanism 44 between a lifting-up position at which the lifting pins 41 protrude upward from the upper surface of the mounting table 3 and a lifting-down position which is equal to or lower than a level of the upper surface of the mounting table 3.

Figure 2:
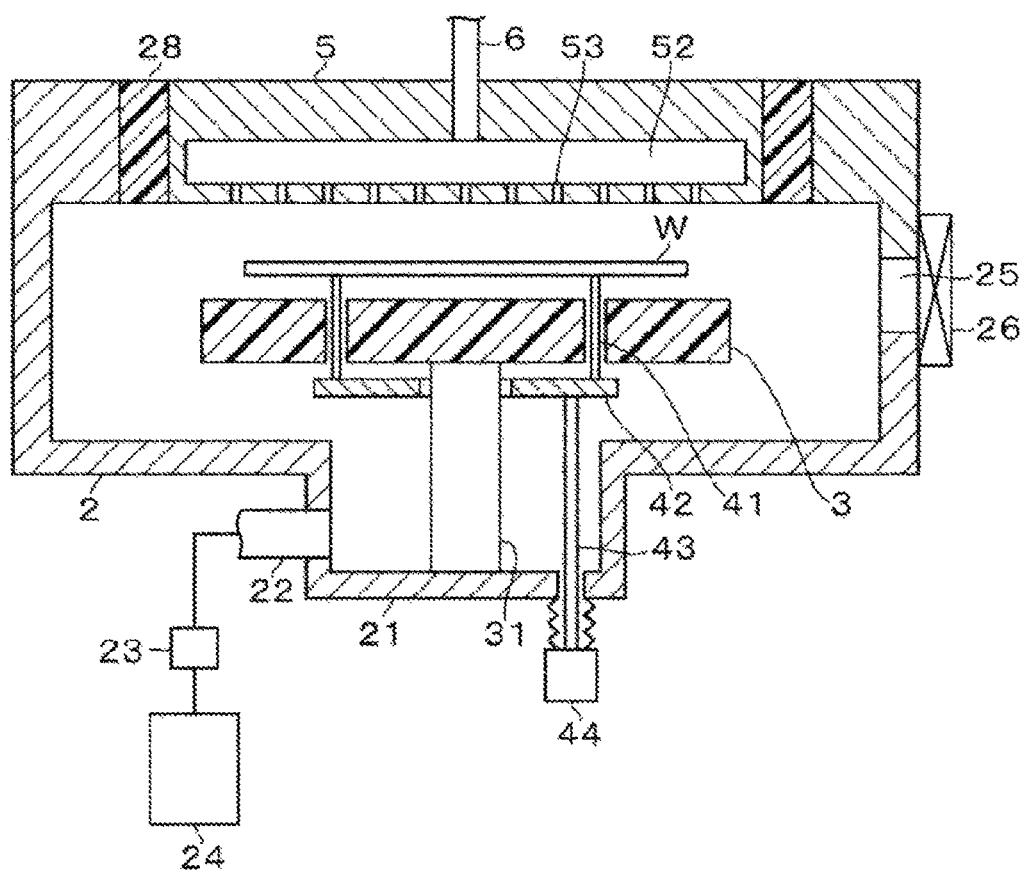
FIG. 2 is a longitudinal sectional view showing a substrate processing apparatus according to an embodiment of the present disclosure.
Figure 3:
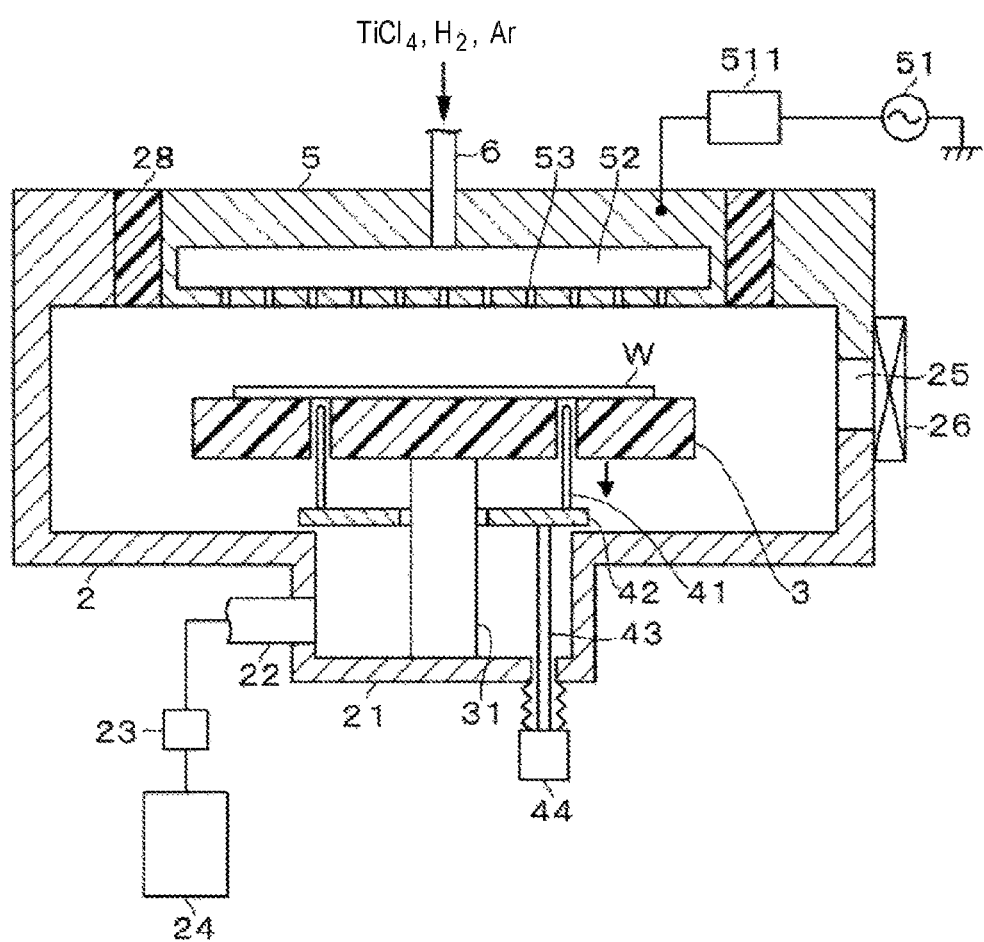
FIG. 3 is a longitudinal sectional view showing a substrate processing apparatus according to an embodiment of the present disclosure.
Figure 4:
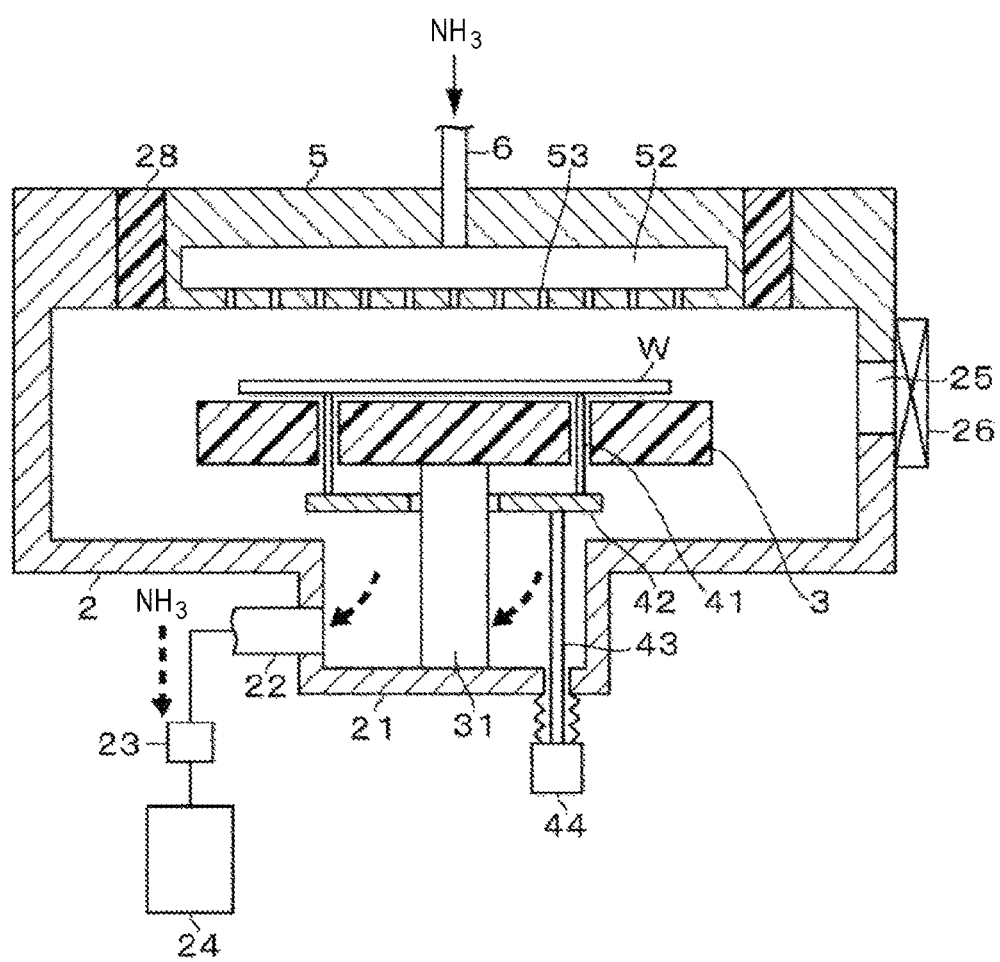
FIG. 4 is a longitudinal sectional view showing a substrate processing apparatus according to an embodiment of the present disclosure.

Examples of the lifting-up position may include a transfer position at the time of transferring the wafer between an external transfer mechanism and the mounting table 3 (a position of the wafer W shown in FIG. 2) and an ascending position at which the wafer W is lifted up from the upper surface of the mounting table 3 when an internal pressure of the vacuum vessel 2 is changed as described later (a position of the wafer W shown in FIG. 4). The following description will be made on the assumption of that the position shown in FIG. 2 is the transfer position and the position shown in FIG. 4 is the ascending position. A position at which the wafer W is mounted on the mounting table 3 refers to a descending position, as shown in FIGS. 1 and 3.

A gas supply part 5 used as an upper electrode is installed in a ceiling wall 27 of the vacuum vessel 2 with an insulating member 28 interposed between the ceiling wall 27 and the gas supply part 5. The gas supply part 5 is coupled to a high frequency power supply 51 via a matching device 511. When a high frequency (RF) of, e.g., 450 kHz is applied from the high frequency power supply 51 to the gas supply part 5, a high frequency electric field is generated between the upper electrode as the gas supply part 5 and the lower electrode 33.

The gas supply part 5 includes a hollow gas supply chamber 52. A plurality of holes 53 through which a processing gas is dispersively supplied into the vacuum vessel 2, is formed in a bottom surface of the gas supply chamber 52 at regular intervals, for example. Further, the gas supply part 5 includes a heating mechanism 54 embedded therein, for example, above the gas supply chamber 52. Based on a control signal from the control part 100 described later, power is applied from a power supply (not shown) to the heating mechanism 54 so that the heating mechanism 54 is heated to a preset temperature.

A gas supply path 6 is installed in the gas supply chamber 52. A plurality of gas supply sources 61 to 64 is connected to an upstream portion of the gas supply path 6. In this embodiment, the gas supply source 61 is to supply a $TiCl_4$ as a Ti compound gas, the gas supply source 62 is to supply a hydrogen ($H_2$) gas as a reducing gas, the gas supply source 63 is to supply an ammonia ($NH_3$) gas as a nitriding gas, and the gas supply source 64 is to supply an argon (Ar) gas. In this embodiment, the $TiCL_4$ gas and the $H_2$ gas correspond to a film-forming gas. The film-forming gas and the nitriding gas are referred to as a "processing gas."

These gas supply sources 61 to 64 are coupled to the gas supply path 6 through supply paths 611, 621, 631 and 641, respectively. The supply paths 611, 621, 631 and 641 include valves V1 to V4 and mass flow controllers M1 to M4, respectively. Each of the valves V1 to V4 and each of the mass flow controllers M1 to M4 are configured to control a flow rate of gas and supply/shut off operations of the gas, based on a control signal Q provided from the control part 100, which will be described later.

The substrate processing apparatus 1 is provided with the control part 100 including a computer configured to control the entire operation of the apparatus 1. The control part 100 includes a program storage part 101 to store a program for executing a film forming process (which will be described later). The term "program" used herein may include software such as a processing recipe. This program is to send control signals to respective components of the apparatus 1 so as to control operations of the respective components. The program is organized with instructions for executing various processes (which will be described later). The program is installed from a storage medium such as a hard disk, a compact disc, a magneto-optic disk, a memory card, a flexible disk or the like, in the control part 100. In addition, the program storage part 101 stores a program for outputting control signals to execute a first step, a second step and a third step (which will be described later) and a program for outputting a control signal to repeat a sequence of the first and second steps a multiple number of times.

The first step is to supply the processing gas onto the wafer W mounted on the mounting table 3 and to set the internal pressure of the vacuum vessel 2 to a first pressure. The second step is to change the internal pressure of the vacuum vessel 2 to a second pressure lower than the first pressure, after the first step. The third step is to change the internal pressure of the vacuum vessel 2 and simultaneously to lift up the wafer W from the mounting table 3 by the lifting pins 41, after the first step.

Figure 5:
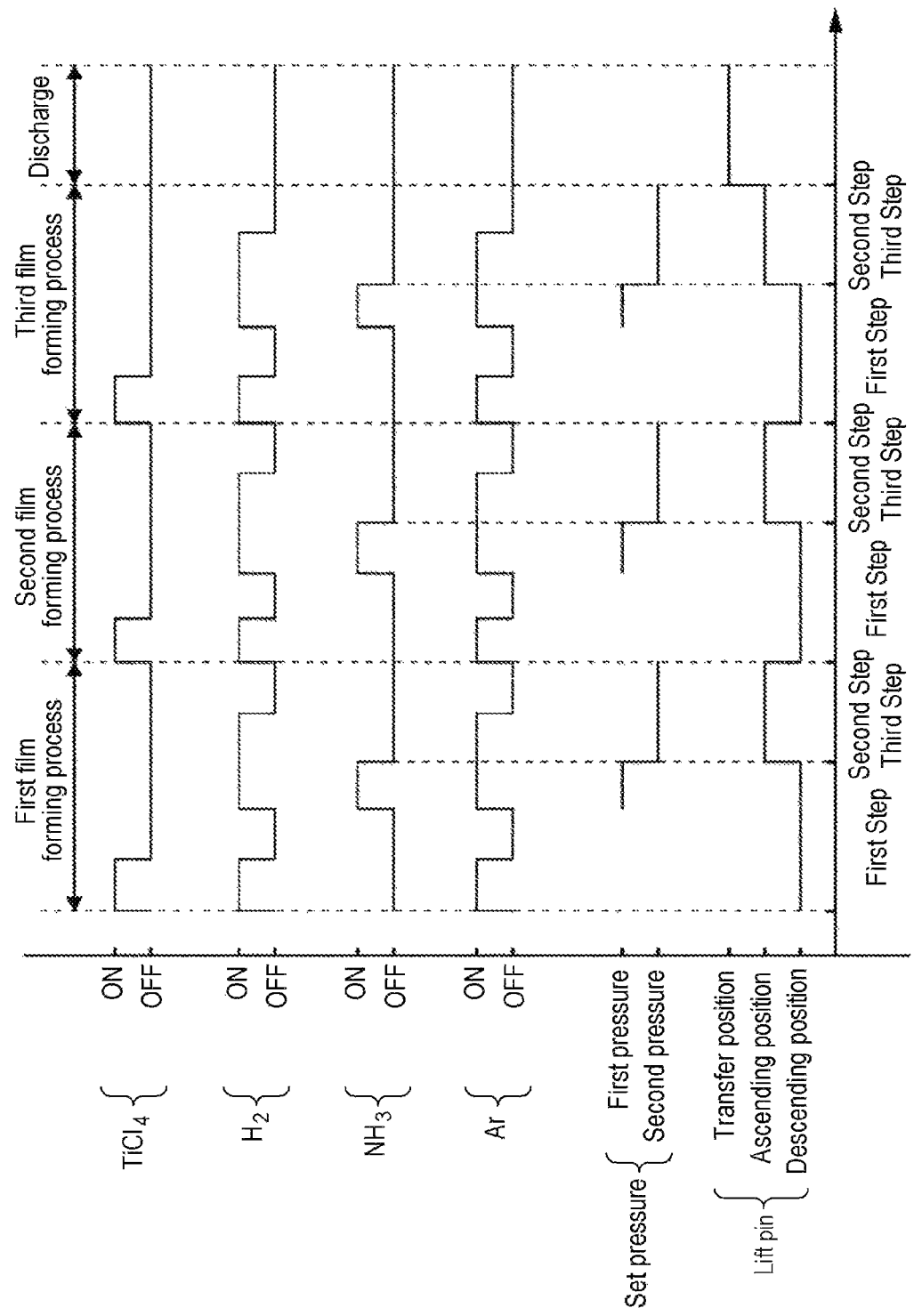
FIG. 5 is a process view showing an example of a film forming process performed in the substrate processing apparatus.

Next, the film forming process performed in the substrate processing apparatus 1 will be described with reference to FIGS. 2 to 5. FIG. 5 schematically shows a state where the processing gas such as the $TiCL_4$ gas and so on, the internal pressure of the vacuum vessel 2 and the height of the lifting pins 41 are changed as the film forming process proceeds. In FIG. 5, a horizontal axis represents a timeline which is segmented for ease of illustration, regardless of an actual processing time.

As for the processing gas, a state where the processing gas is being supplied into the vacuum vessel 2 is referred to as an "ON" state and a state where the supply of the processing gas is stopped is referred to as an "OFF" state. As for the internal pressure of the vacuum vessel 2, only the first pressure and the second pressure are shown, but pressures at the time of introducing the $TiCl_4$ gas and unloading the wafer are omitted. A height position of the lifting pins 41 is assumed to include three positions: the transfer position, the ascending position and the descending position.

First, as shown in FIG. 2, the wafer W is loaded into the vacuum vessel 2 by the external transfer mechanism (not shown) and subsequently, the lifting pins 41 are raised up to the transfer position such that the wafer W is delivered on the lifting pins 41 from the external transfer mechanism. Thereafter, the external transfer mechanism is lowered and the lifting pins 41 are moved down to the descending positon as shown in FIG. 3 so that the wafer W is mounted on the mounting table 3. Meanwhile, once the external transfer mechanism is lowered, the gate valve 26 is closed and the first step is performed in the vacuum vessel 2.

The mounting table 3 and the gas supply part 5 have been already heated by the heating mechanisms 34 and 54, respectively, so that the wafer W is heated to a temperature of 400 degrees C. or higher when it is mounted on the mounting table 3. An example of a process temperature of the wafer W may include 450 degrees C. In addition, the interior of the vacuum vessel 2 is set to a preset pressure by the vacuum-exhausting part 24. Subsequently, as shown in FIGS. 3 and 5, the $TiCl_4$ gas, the $H_2$ gas and the Ar gas as the film-forming gas are supplied into the vacuum vessel 2 via the gas supply part 5, and the high frequency power supply 51 applies a high frequency power to the gas supply part 5 based on a control signal P provided from the control part 100. Thus, a parallel flat electrode constituted by the upper electrode used as the gas supply part 5 and the lower electrode 33 is formed, generating capacitively-coupled plasma. As a result, the $TiCl_4$ gas and the $H_2$ gas are activated to react with each other so that a Ti film is formed on a surface of the wafer W.

Subsequently, as shown in FIG. 5, the supply of the $TiCl_4$ gas, the $H_2$ gas and the Ar gas is stopped and the application of the high frequency power to the gas supply part 5 is also stopped. Further, the interior of the vacuum vessel 2 is exhausted to discharge the $TiCl_4$ gas, the $H_2$ gas and the Ar gas therefrom.

Thereafter, the internal pressure of the vacuum vessel 2 is set to the first pressure, and the $H_2$ gas, the $NH_3$ gas and the Ar gas are supplied into the vacuum vessel 2 so that a surface of the Ti film is subjected to a nitriding process. The first pressure is higher than the preset pressure when the $TiCl_4$ gas and the $H_2$ gas are supplied into the vacuum vessel 2. For example, the first pressure is 400 Pa. The $NH_3$ gas nitrides the Ti film to form a titanium nitride (TiN) film on the surface of the Ti film. In addition, the Ar gas and the $H_2$ gas, severing as carrier gases of the $NH_3$ gas, are supplied to uniformly supply a raw material gas onto the wafer and adjust a partial pressure of the $NH_3$ gas. In this embodiment, the nitriding process based on the $NH_3$ gas is performed without generating any plasma, but may be performed with a plasmarized $NH_3$ gas.

After the nitriding process is completed, the second step is initiated. In the second step, for example, as shown in FIG. 5, the supply of the $NH_3$ gas is stopped and the $NH_3$ gas existing in the vacuum vessel 2 is discharged so that the internal pressure of the vacuum vessel 2 is changed to the second pressure lower than the first pressure. The second pressure is lower than the first pressure by 100 Pa or more, which corresponds to a so-called vacuum state. For example, the second pressure is the smallest pressure (e.g., 150 Pa) within a pressure range set by the pressure adjusting part 23. In this embodiment, the internal pressure of the vacuum vessel 2 is set to the second pressure by the pressure adjusting part 23 based on a control signal provided from the control part 100 according to the processing recipe. In some embodiments, the second pressure may be achieved by maximizing an opening degree of a pressure regulating valve included in the pressure adjusting part 23.

In addition, after the first step is completed, the third step is initiated to change the internal pressure of the vacuum vessel 2 and simultaneously, lift up the wafer W from the mounting table 3 by the lifting pins 41. In the third Step, the lifting pins 41 are raised up to the ascending position. The ascending position may be a position at which the wafer W is sufficiently lifted up from the upper surface of the mounting table 3 by the lifting pins 41. As an example, a lower surface of the wafer W may be spaced apart from the upper surface of the mounting table 3 by a distance of 0.5 mm or more. In some embodiments, the ascending position may be the same level as that of the transfer position of the wafer.

Subsequently, while maintaining the internal pressure of the vacuum vessel 2 at the second pressure, the supply of the Ar gas and the $H_2$ gas is stopped and the interior of the vacuum vessel 2 continues to be exhausted for a predetermined period of time. In this way, a first film forming process (including the Ti film forming process and the subsequent nitriding process) are completed. Thereafter, second and third film forming processes (which are similar to the first forming process) are initiated. That is to say, the sequence of the first and second steps are repeated a multiple number of times (three times, in this embodiment). A sequence of the second and third film forming processes and process conditions thereof are similar to those of the first film forming process.

After the first film forming process is completed, for example, as shown in FIG. 5, the second film forming process is initiated in which the lifting pins 41 are lowered down to the descending position and the first step as described above is performed. That is to say, the supply of the $TiCl_4$ gas, the $H_2$ gas and the Ar gas is resumed and plasma is generated in the vacuum vessel 2 so that a new Ti film is formed on the surface of the wafer W. Subsequently, the $TiCl_4$ gas, the $H_2$ gas and the Ar gas are discharged such that the internal pressure of the vacuum vessel 2 is set to the first pressure. And, the supply of the $NH_3$ gas, the Ar gas and the $H_2$ gas is resumed to nitride a surface of the new Ti film. After the first step is completed, the supply of the $NH_3$ gas is stopped, and the second step of changing the internal pressure of the vacuum vessel 2 to the second pressure lower than the first pressure and simultaneously the third step of lifting up the wafer W from the mounting table 3 by the lifting pins 41 are initiated. Subsequently, while maintaining the internal pressure of the vacuum vessel 2 at the second pressure, the supply of the Ar gas and the $H_2$ gas is stopped and the interior of the vacuum vessel 2 continues to be exhausted for a predetermined period of time. In this way, the second film forming process is completed. The third film forming process (including the Ti film forming process and a subsequent nitriding process) is performed in the same manner as that described above.

After the third film forming process is completed, i.e., after the supply of the Ar gas and the $H_2$ gas is stopped while maintaining the internal pressure of the vacuum vessel 2 at the second pressure and the interior of the vacuum vessel 2 continues to be exhausted for a predetermined period of time, the internal pressure of the vacuum vessel 2 is changed to a pressure at the time of unloading the wafer W. Thereafter, the lifting pins 41 are moved up to the transfer position and subsequently, the gate valve 26 is opened such that the external transfer mechanism advances into the vacuum vessel 2. Subsequently, the lifting pins 41 are lowered to deliver the wafer W to the transfer mechanism. In this way, the wafer W is unloaded from the vacuum vessel 2.

According to the above embodiment, since the internal pressure of the vacuum vessel 2 is changed to the second pressure lower than the first pressure and simultaneously, the wafer W is lifted up from the mounting table 3 by the lifting pins 41, it is possible to prevent the wafer W on the mounting table 3 from sliding due to the pressure variation.

Once the internal pressure of the vacuum vessel 2 is reduced from the first pressure to the second pressure, the processing gas introduced between the upper surface of the mounting table 3 and the wafer W is discharged. A flow of the discharged processing gas acts on the wafer W mounted on the mounting table 3, thus causing sliding of the wafer W.

In contrast, as described in this embodiment, the wafer W is lifted up from the mounting table 3 by the lifting pins 41 at the time of changing the internal pressure so that the wafer W is in point-contact with the tips of the lifting pins 41. As such, a load to be applied to respective support points is increased compared to a case where the wafer W is supported while being in surface-contact with the mounting table, which results in an increased static frictional force. Thus, more force is required in moving the wafer W. Accordingly, it is possible to prevent the wafer W on the mounting table 3 from sliding even when some degree of force is exerted on the wafer W due to the pressure variation.

In other words, if the wafer W is lifted up from the mounting table 3 by the lifting pins 41 at the time of changing the internal pressure of the vacuum vessel 2, the wafer W is less susceptible to the action of the flow of the processing gas, thereby preventing the wafer W on the mounting table 3 from sliding. In addition, if an extent of lifting-up of the wafer W from the mounting table 3 is increased, a space between the upper surface of the mounting table 3 and the rear surface of the wafer W is also increased. This allows the wafer W to be less affected by the flow of the processing gas. Such a method of preventing the wafer W from sliding may be applied not only at the time of changing of the internal pressure but also at the time of significantly adjusting the flow rate of the processing gas.

As described above, the wafer W is prevented from sliding, thus preventing the occurrence of particles which are caused by the sliding of the wafer W on the mounting table 3. In addition, the wafer is prevented from being too close to the guide ring 32 due to the sliding. This suppresses a deviation in concentration distribution of the film-forming gas, which suppresses deterioration in in-plane uniformity of film thickness and also suppresses contamination of the rear surface of the wafer W from being partially increased.

In addition, in the above embodiment, since the film forming process is repeatedly performed a multiple number of times, it is possible to increase a film thickness of the Ti film while maintaining in-plane uniformity. The present inventors have found that a prolonged period of time for a single film forming process degrades the in-plane uniformity of film thickness, which makes it hard for the film thickness of the Ti film to be increased compared to the aforementioned process. The reason for this may be that, if the period of time for the single film forming process is prolonged, reaction products adhere to an inner wall of the vacuum vessel 2 so that the $H_2$ gas is consumed by the reaction products. In contrast, in the case where the film forming process is repeated a multiple number of times, the $NH_3$ gas is supplied for each film forming process so that the consumption of the $H_2$ gas by the reaction products is suppressed. This suppresses the in-plane uniformity of film thickness from deteriorating and also achieves an increase in thickness of the Ti film.

When the film forming process is performed a multiple number of times, the pressure variation between the first pressure and the second pressure is repeated. In this case, the wafer W is prevented from sliding due to the lifting-up of the wafer W by the lifting pins 41, thus preventing the in-plane uniformity of the film thickness from being lowered. That is to say, if the wafer W mounted on the mounting table 3 slides, an in-plane distribution of the concentration of gas supplied onto the wafer W for each film forming process is varied, which degrades the in-plane uniformity of film thickness. However, in this embodiment, since the wafer W is prevented from sliding, there is no possibility of the occurrence of such a situation.

Further, as described above, the average surface roughness Ra of the surface of the mounting table 3 is set to 10 μm or more. This further prevents the wafer W from sliding at the time of the pressure variation. Thus, by setting the average surface roughness Ra of the surface of the mounting table 3 to 10 μm or more, the static frictional force against the wafer W is increased so that more force is required in moving the wafer W.

In addition to the change of the internal pressure of the vacuum vessel 2 from the first pressure to the second pressure, the internal pressure of the vacuum vessel 2 may be varied when the $TiCl_4$ gas and the $H_2$ gas are introduced into the vacuum vessel 2 and then discharged from the vacuum vessel 2, when the $NH_3$ gas is introduced into the vacuum vessel 2, or the like. Also in these cases, there is a possibility that the wafer W may slide. In addition, the wafer W may slide due to an impact applied to the wafer W when lifting up the wafer W by the lifting pins 41. Accordingly, by making the surface of the mounting table 3 rough, it is possible to prevent the wafer W on the mounting table 3 from sliding when any force acts on the wafer W. In a high temperature plasma process performed in an apparatus such as the aforementioned substrate processing apparatus 1, a metal mechanical chuck and an electrostatic chuck cannot be employed. Thus, the method of the present disclosure is effective in preventing the wafer from sliding during the film forming process.

The following description will be made on a timing at which the wafer W is lifted up by the lifting pins 41. To begin with, there is a need to mount the wafer W on the mounting table 3 before the film-forming gas is supplied. This is because, if the wafer W is lifted up from the mounting table 3 when the film-forming gas is supplied, an abnormal discharge is likely to occur when the film-forming gas is plasmarized so that a film may be formed on the rear surface of the wafer W. This may generate unwanted particles.

Further, there is a need to mount the wafer on the mounting table 3 for a predetermined period of time from the supply of the nitriding gas. This is because the nitriding gas serves also to consume the film-forming gas introduced between the upper surface of the mounting table 3 and the rear surface of the wafer W or the film-forming gas adhering to the interior of the vacuum vessel 2 and, therefore, if the wafer is lifted up from the mounting table 3 in a state where the nitriding gas is insufficiently supplied, the film-forming gas is introduced into the side of the rear surface of the wafer W, thus contaminating the rear surface of the wafer.

Accordingly, the third step of lifting up the wafer W from the mounting table 3 by the lifting pins 41 may be initiated before the internal pressure is changed from the first pressure to the second pressure, after the first step. Herein, the expression "after the first step" may include immediately before the first step is completed. With the above-described film forming process as an example, the internal pressure of the vacuum vessel 2 may be changed from the first pressure to the second pressure by supplying the $NH_3$ gas into the vacuum vessel 2, followed by raising the lifting pins 41 up to the ascending position after a predetermined period of time, followed by stopping the supply of the $NH_3$ gas. The predetermined period of time after the supply of the $NH_3$ gas refers to a period of time required for the $NH_3$ gas to consume the $TiCl_4$ gas and the $H_2$ gas introduced between the mounting table 3 and the wafer W, or the $TiCl_4$ gas and the $H_2$ gas adhering to the interior of the vacuum vessel 2.

In some embodiments, the mounting table may be installed to be elevated by an elevating mechanism installed outside of the vacuum vessel, and the lifting pins as an elevating member may be installed at a fixed height position. In this configuration, the mounting table is lifted up and down between an ascending position at which the elevating member protrudes upward from a surface of the mounting table and a descending position equal to or lower than a level of the surface, relative to the elevating member. In some embodiments, the elevating member may be installed separately from lifting pins configured to deliver a substrate between the external transfer mechanism and the mounting table.

Further, the substrate process is not limited to the CVD process but may be an ALD (Atomic Layer Deposition) process or an etching process. Further, the substrate process may be applied to a process whose process temperature is 400 degrees C. or less and a process which generates no plasma in a vacuum vessel.

In some embodiments, in the case where the sequence of the first and second steps is repeated a multiple number of times during a period of time between the loading of the substrate into the vacuum vessel and the unloading of the substrate from the vacuum vessel, respective processes in the first and second steps may be different from each other. As an example, different processing gases and different first and second pressures may be used in the first and second steps in each of first and second film forming processes.

EXAMPLES

Evaluation tests conducted in the context of the present disclosure will be described below. With the average surface roughness Ra of the surface of the mounting table 3 of the above-described substrate processing apparatus 1 set to 10 µm, an amount of sliding of the wafer W when a Ti film was formed with the sequence shown in FIG. 5 was evaluated (Example 1). A type of the processing gas, the first and second pressures and the ascending position of the lifting pins 41 in the third step were as described above. The amount of sliding of the wafer W was evaluated using a position sensor installed in a transfer vessel (not shown) connected to the vacuum vessel 2 at a timing when the third film forming process with the sequence shown in FIG. 5 is completed and subsequently the wafer W is unloaded from the vacuum vessel 2. A deviation of the central position of the wafer W when the wafer W is transferred onto the mounting table 3 was evaluated by measuring the central position of the wafer W using the position sensor. In addition, the central position of the wafer W before the wafer W is mounted on the mounting table 3 was measured by the position sensor in advance before the wafer W is loaded into the vacuum vessel 2. The number of test wafers W was about 400.

In addition, with the average surface roughness Ra of the surface of the mounting table 3 set to 2 µm, the same evaluation was conducted when a Ti film was formed with the sequence shown in FIG. 5 (Example 2). Further, with the average surface roughness Ra of the surface of the mounting table 3 set to 2 µm, the same evaluation was conducted when an $NH_3$ gas is discharged while mounting the wafer W on the mounting table 3 without lifting up the wafer W by the lifting pins 41 in the third step (Comparative Example 1).

Figure 6:
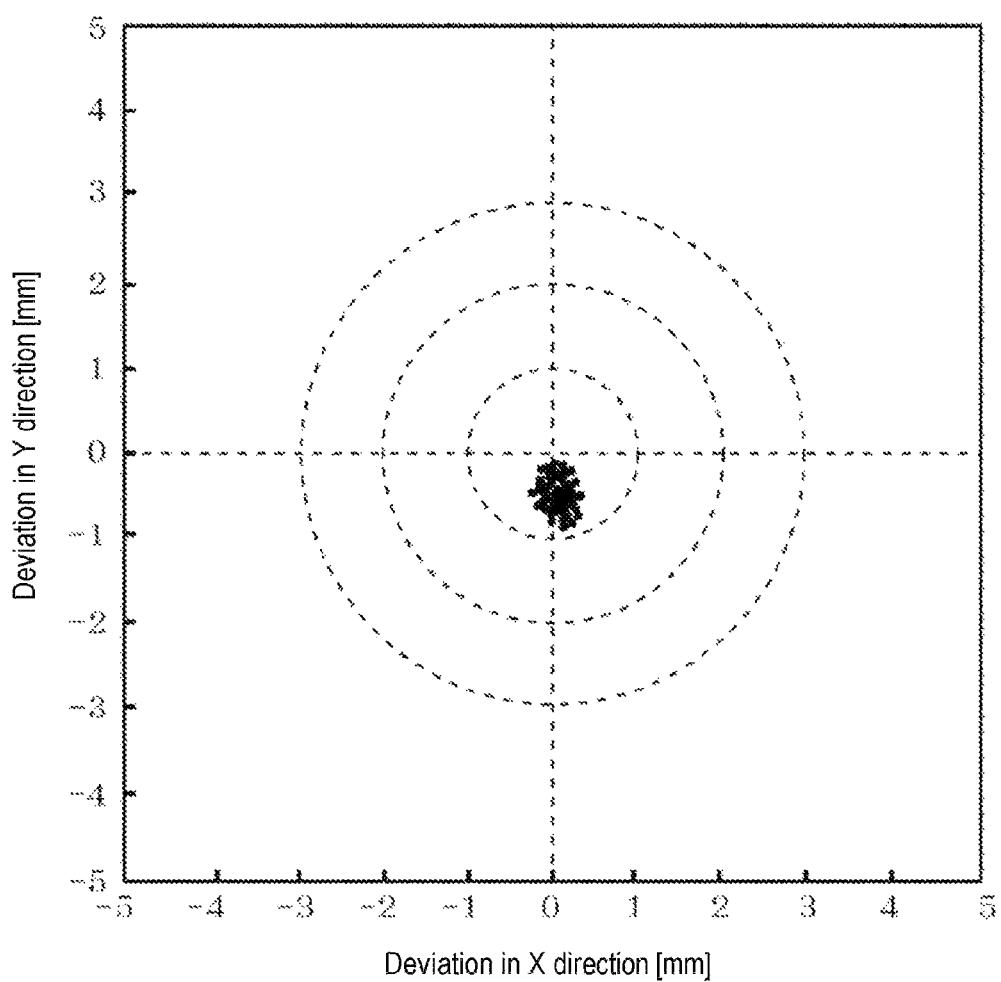
FIG. 6 is a characteristic view showing a result of an evaluation test.
Figure 7:
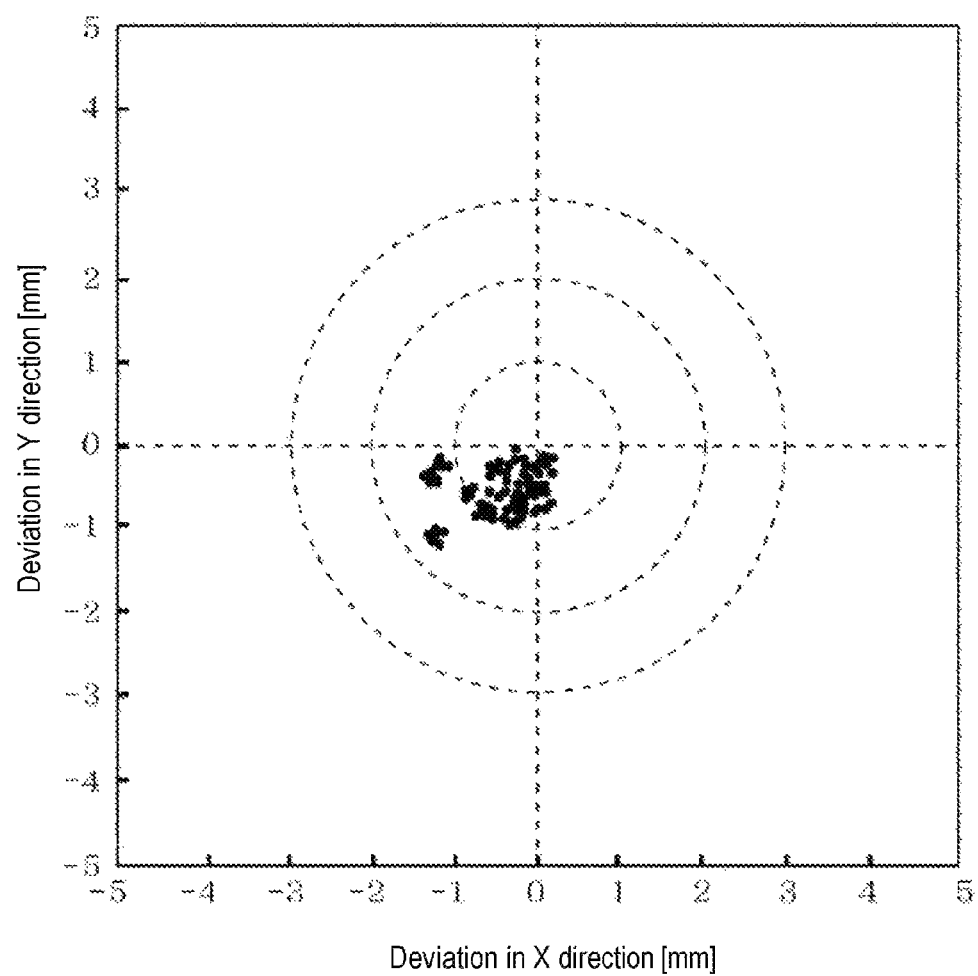
FIG. 7 is a characteristic view showing a result of an evaluation test.
Figure 8:
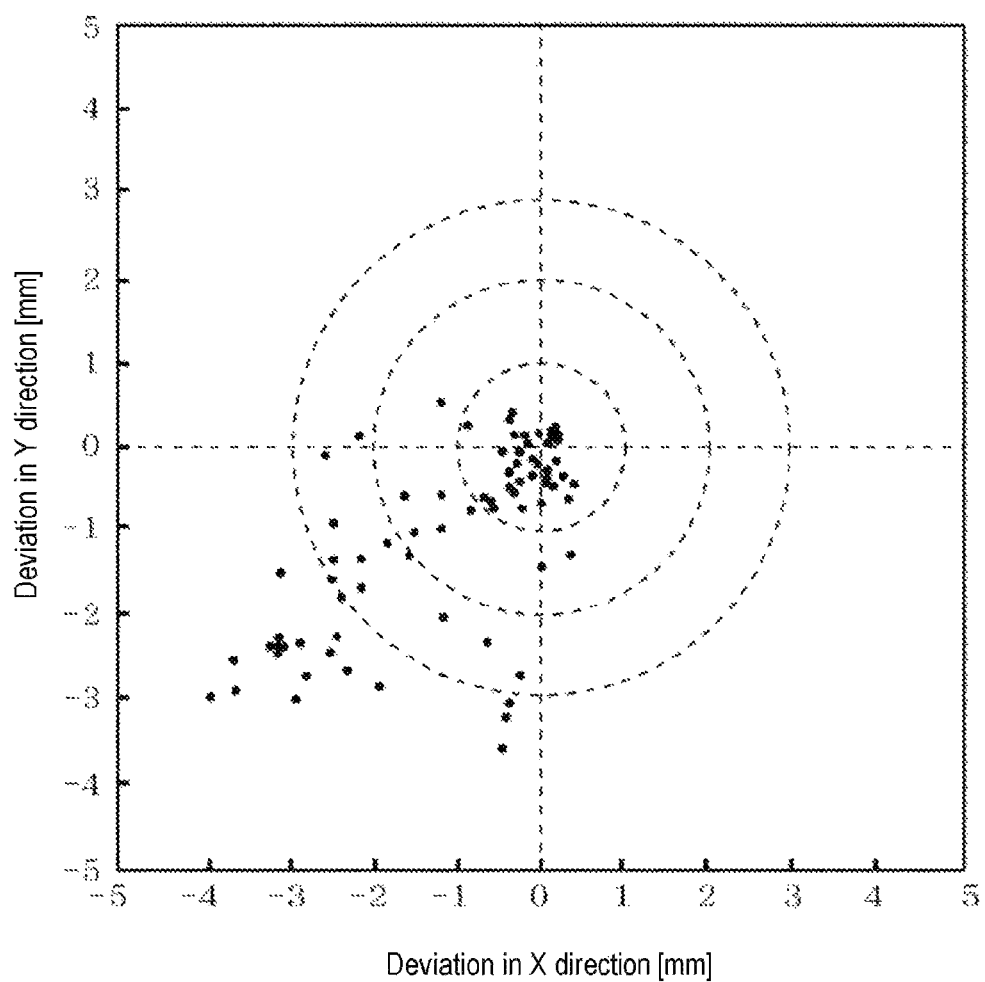
FIG. 8 is a characteristic view showing a result of an evaluation test.

The results of these evaluation tests are shown with some of the actual data schematized in FIG. 6 for Example 1, FIG. 7 for Example 2 and FIG. 8 for Comparative Example 1, respectively. In each of FIGS. 6 to 8, a horizontal axis represents a deviation (mm) in an X direction and a vertical axis represents a deviation (mm) in a Y direction. A position at which the deviations in both the X and Y directions are zero corresponds to the central position of the surface of the mounting table 3, around which central positions of the wafer W are plotted.

From a comparison between Example 2 and Comparative Example 1, it is confirmed that the deviation is significantly decreased in Example 2, whereas significant sliding having the deviation of 1 mm or more occurs frequently in Comparative Example 1. Thus, it is confirmed that the wafer W on the mounting table 3 is prevented from sliding throughout the film forming process by lifting up the wafer W by the lifting pins 41 when the internal pressure of the vacuum vessel 2 is changed from the first pressure to the second pressure. Thus, the effects of the present disclosure were confirmed.

In addition, from a comparison between Example 1 and Example 2, it is confirmed that the deviation is limited to be less than 0.5 mm in Example 1, which is significantly smaller than that in Example 2. Thus, it is confirmed that the wafer W on the mounting table 3 is further prevented from sliding by setting the average surface roughness Ra of the surface of the mounting table 3 to 10 µm. Accordingly, it can be understood that the sliding of the wafer W which is caused by pressure variations other than the pressure variation at the time of changing the internal pressure of the vacuum vessel 2 from the first pressure to the second pressure, or when lifting up the wafer W by the lifting pins 41, can be effectively prevented.

According to the present disclosure in some embodiments, in performing a process on a substrate by supplying a processing gas onto the substrate in a vacuum atmosphere, the processing gas is supplied onto the substrate mounted on a mounting table and simultaneously an internal pressure of a vacuum vessel is set to a first pressure. Thereafter, the internal pressure is changed to a second pressure lower than the first pressure. Subsequently, the substrate is lifted up from the mounting table by an elevating member before changing the internal pressure or in parallel with the changing.

When the internal pressure is changed from the first pressure to the second pressure, the processing gas introduced between a surface of the mounting table and the substrate is discharged and a flow of the processing gas acts on the substrate mounted on the surface of the mounting table. If the substrate is lifted up from the mounting table by the elevating member when changing the internal pressure, the substrate is less affected by the flow of the processing gas, thereby preventing the substrate on the mounting table from sliding during the film forming process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate by supplying a processing gas onto the substrate in a vacuum atmosphere, the method comprising:
   a) mounting the substrate on a mounting table installed in a vacuum vessel;
   b) supplying a film-forming gas as the processing gas onto the substrate mounted on the mounting table to form a thin film;
   c) subsequently, setting an internal pressure of the vacuum vessel to a first pressure to supply a nitriding gas as the processing gas to nitride the thin film;
   d) after completion of the nitriding the thin film, lifting up the substrate from the mounting table by an elevating member; and e) after completion of the nitriding the thin film, changing the internal pressure to a second pressure lower than the first pressure after process d) or simultaneously with process d), wherein the second pressure is a pressure after completion of the nitriding, and wherein the sequence including the process a) to the process e) is repeated on the substrate a multiple number of times during a period of time from when the substrate is loaded into the vacuum vessel until when the substrate is unloaded from the vacuum vessel.

\* \* \* \* \*